(12) United States Patent
Kim et al.

(10) Patent No.: US 10,014,216 B2
(45) Date of Patent: Jul. 3, 2018

(54) METHOD FOR MANUFACTURING SEMICONDUCTOR DEVICE USING HIGH SPEED EPITAXIAL LIFT-OFF AND TEMPLATE FOR III-V DIRECT GROWTH AND SEMICONDUCTOR DEVICE MANUFACTURED USING THE SAME

(71) Applicant: KOREA INSTITUTE OF SCIENCE AND TECHNOLOGY, Seoul (KR)

(72) Inventors: Sanghyeon Kim, Seoul (KR); Daemyeong Geum, Seoul (KR); Min Su Park, Seoul (KR); Won Jun Choi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 17 days.

(21) Appl. No.: 14/854,221

(22) Filed: Sep. 15, 2015

(65) Prior Publication Data
US 2016/0343810 A1    Nov. 24, 2016

(30) Foreign Application Priority Data

May 19, 2015   (KR) .................. 10-2015-0069836

(51) Int. Cl.
*H01L 21/02*   (2006.01)
*H01L 21/20*   (2006.01)
(Continued)

(52) U.S. Cl.
CPC ............ *H01L 21/78* (2013.01); *H01L 21/185* (2013.01); *H01L 21/6835* (2013.01);
(Continued)

(58) Field of Classification Search
CPC ......... H01L 21/30604; H01L 21/30608; H01L 21/30612; H01L 21/30617;
(Continued)

(56) References Cited

U.S. PATENT DOCUMENTS 7,773,649 B2   8/2010   Kim et al.
9,356,187 B2   5/2016   Ryu et al.
(Continued)

FOREIGN PATENT DOCUMENTS

KR   10-2007-0100852 A   10/2007
KR   10-1278063 B1   6/2013
(Continued)

OTHER PUBLICATIONS

Wu et al., "Improvement in Etching Rate for Epilayer Lift-Off with Surfactant", 2013, Physics, Simulation, and Photonic Engineering of Photovoltaic Devices II, edited by Alexandre Freundlich, Jean-Francois Guillemoles, Proc. of SPIE vol. 8620, pp. 86201Y-1 to 86201Y-6.*

(Continued)

*Primary Examiner* — Natalia Gondarenko
(74) *Attorney, Agent, or Firm* — NSIP Law

(57) ABSTRACT

Disclosed is a method for manufacturing a semiconductor device, which includes providing a template having a first substrate and a patterned first III-V group compound layer located on the first substrate, forming a sacrificial layer on the patterned first III-V group compound layer by epitaxial growth, forming a second III-V group compound layer on the sacrificial layer by epitaxial growth, bonding a second substrate made of silicon onto the second III-V group compound layer, and separating the second III-V group compound layer and the second substrate from the template by removing the sacrificial layer.

13 Claims, 17 Drawing Sheets

(51) Int. Cl.
| | |
|---|---|
| *H01L 21/36* | (2006.01) |
| *H01L 21/78* | (2006.01) |
| *H01L 21/683* | (2006.01) |
| *H01L 21/18* | (2006.01) |
| *H01L 31/0304* | (2006.01) |
| *H01L 29/267* | (2006.01) |
| *H01L 29/66* | (2006.01) |
| *H01L 29/861* | (2006.01) |
| *H01L 29/20* | (2006.01) |

(52) U.S. Cl.
CPC ...... *H01L 29/267* (2013.01); *H01L 29/66219* (2013.01); *H01L 29/861* (2013.01); *H01L 31/0304* (2013.01)

(58) Field of Classification Search
CPC .......... H01L 21/30625; H01L 21/3063; H01L 21/308; H01L 29/165; H01L 29/861; H01L 29/267; H01L 29/66219; H01L 31/0304; H01L 21/6835; H01L 21/78; H01L 21/185; H01L 21/187; H01L 21/8258; H01L 21/7813; H01L 21/02293; H01L 21/2018; H01L 21/2022–21/2026; H01L 21/3147; H01L 21/02365–21/02694; H01L 33/0062–33/0079; H01L 33/0025; H01L 33/002; H01L 21/3205–21/32155; H01L 21/4763–21/47635; H01L 21/02019; H01L 21/306–21/30621; H01L 21/31111; H01L 21/31133; H01L 21/32133–21/32137; H01L 21/67023; H01L 21/67075–21/67086; H01L 2224/85931; H01L 2224/86031; H01L 21/20; H01L 21/2007; H01L 21/2015; H01L 21/2036; H01L 21/2056; H01L 21/2085; H01L 21/2215; H01L 21/02381; H01L 21/02389; H01L 21/02395; H01L 21/02392; H01L 21/02488; H01L 21/02538; H01L 21/02543; H01L 21/02546; H01L 21/02631; H01L 21/02636; H01L 21/02639; H01L 21/0268; H01L 33/00025; H01L 33/30–33/325; H01L 21/02013; H01L 21/02032; H01L 21/0625; H01L 39/2441; H01L 39/2432; H01L 29/2003
USPC .......... 257/183, 52, 614, 506, 629, E21.567, 257/E29.003, E29.094, E27.112, E29.002, 257/76, 615; 438/455, 478, 483
See application file for complete search history.

(56) References Cited

U.S. PATENT DOCUMENTS

| | | |
|---|---|---|
| 2009/0044860 A1 | 2/2009 | Pan et al. |
| 2011/0186910 A1 | 8/2011 | Forrest et al. |
| 2013/0119401 A1* | 5/2013 | D'Evelyn ......... H01L 21/02609 257/76 |
| 2014/0138702 A1* | 5/2014 | Choi ................. H01L 21/02032 257/76 |
| 2014/0370716 A1* | 12/2014 | Lee ..................... H01L 31/1896 438/715 |
| 2015/0079766 A1* | 3/2015 | Baron ............... H01L 21/02381 438/478 |
| 2015/0187652 A1 | 7/2015 | Yamamoto et al. |

FOREIGN PATENT DOCUMENTS

| | | |
|---|---|---|
| KR | 10-2014-0022131 A | 2/2014 |
| KR | 10-1455724 B1 | 10/2014 |
| WO | WO 2013/006803 A2 | 1/2013 |

OTHER PUBLICATIONS

Selective etching of AlAs using HF and acetone, Google Search, proceedings.spiedigitallibrary.org/proceeding.aspx?articleid=1672525, downloaded on Mar. 3, 2017.*

Yoon, Jongseung, et al. "GaAs photovoltaics and optoelectronics using releasable multilayer epitaxial assemblies." Nature 465.7296 (2010): 329-333.

Lee, Kyusang, et al. "Reuse of GaAs substrates for epitaxial lift-off by employing protection layers." Journal of Applied Physics 111.3 (2012): 033527.

Cheng, Cheng-Wei, et al. "Epitaxial lift-off process for gallium arsenide substrate reuse and flexible electronics." Nature communications 4 (2013): 1577.

Wu, Fan-Lei, et al. "Improvement in separation rate of epitaxial lift-off by hydrophilic solvent for GaAs solar cell applications." Solar Energy Materials and Solar Cells 122 (2014): 233-240.

Pan, N. "Epitaxial lift-off of large-area GaAs multi-junction solar cells for high efficiency clean and portable energy power generation." (ICSE), 2014 IEEE International Conference on Semiconductor Electronics. IEEE, (2014): 347-349.

Lee, Kyusang, et al. "Non-Destructive Wafer Recycling for Low-Cost Thin-Film Flexible Optoelectronics." Advanced Functional Materials 24.27 (2014): 4284-4291.

* cited by examiner

METHOD FOR MANUFACTURING SEMICONDUCTOR DEVICE USING HIGH SPEED EPITAXIAL LIFT-OFF AND TEMPLATE FOR III-V DIRECT GROWTH AND SEMICONDUCTOR DEVICE MANUFACTURED USING THE SAME

CROSS-REFERENCE TO RELATED APPLICATION

This application claims priority to Korean Patent Application No. 10-2015-0069836, filed on May 19, 2015, and all the benefits accruing therefrom under 35 U.S.C. § 119, the contents of which in its entirety are herein incorporated by reference.

BACKGROUND

1. Field

Embodiments relate to a method for manufacturing a semiconductor device and a semiconductor device manufactured by the method, and more particularly, to a technique for manufacturing a semiconductor device by using high-speed epitaxial lift-off and a template for direct growth of III-V group compound layers.

2. Description of the Related Art

Silicon (Si) is applied to various kinds of semiconductor devices, representatively a solar cell, a transistor or the like. However, in case of a solar cell, the improvement in efficiency has not been reported after the mid 2000's. Also, in case of a transistor, about 20 nanometer (nm) node process is performed at the present, but problems are caused due to short channel effects. Therefore, there is demanded a next-generation technology for substituting for silicon-based device.

As an alternative for silicon-based devices, III-V group compounds which ensure high mobility, have a direct band gap structure and allow easy band gap engineering are being actively studied. III-V group compounds such as gallium arsenide (GaAs), indium phosphide (InP), gallium nitride (GaN) or the like have various advantages, but there still remain limits in that a variety of industries have silicon-based platforms and also cost-related problems should be overcome.

To solve the above problems, a method for growing III-V group buffer layer for growing III-V group materials on a silicon substrate is being studied. However, if the III-V group buffer layer growing method is used, defects may occur due to a lattice mismatch between the silicon substrate and the III-V group compound layer, a difference in thermal expansion coefficient and a difference in polarity, which may deteriorate quality of a final product.

As an alternative, in order to solve the problems in that an III-V group compound is not easily grown directly on a silicon substrate and a high cost is required, there has been proposed a method of growing an III-V group compound on an III-V group substrate as an epitaxial layer, then bonding the III-V group compound onto a silicon substrate and removing the III-V group substrate by epitaxial lift-off (ELO). However, in an existing ELO process, a substrate bonding technique using a thin sacrificial layer is used, which consumes a long process time, and the long process time after adhesion may damage the substrate due to an etching solution on the substrate surface.

SUMMARY

An aspect of the present disclosure is directed to providing a method for manufacturing a semiconductor device, which may allow repeated manufacture of the semiconductor device by using a large-area template, prepared by transferring only a necessary portion of an epitaxial layer of an III-V group compound of the semiconductor device to a silicon (Si) substrate at a high speed.

In one aspect, there is provided a method for manufacturing a semiconductor device, which includes: providing a template having a first substrate and a patterned first III-V group compound layer disposed on the first substrate; forming a sacrificial layer on the patterned first III-V group compound layer by epitaxial growth; forming a second III-V group compound layer on the sacrificial layer by epitaxial growth; bonding a second substrate made of silicon onto the second III-V group compound layer; and separating the second III-V group compound layer and the second substrate from the template by removing the sacrificial layer.

In an embodiment, the bonding of a second substrate may include directly bonding the second III-V group compound layer and the second substrate to each other. In another embodiment, the bonding of a second substrate may include: forming an adhesive layer on at least one of the second III-V group compound layer and the second substrate; and bonding the second III-V group compound layer and the second substrate to each other by using the adhesive layer. The adhesive layer may include metal or oxide.

In an embodiment, the separating the second III-V group compound layer and the second substrate from the template may include removing the sacrificial layer by using a hydrophilic etching solution containing hydrogen fluoride (HF). At this time, the etching solution further may contain at least one hydrophilic solution such as isopropyl alcohol and acetone.

In an embodiment, the providing of a template may include: forming a sacrificial layer on a support substrate having an III-V group compound; forming an III-V group compound on the sacrificial layer on the support substrate by epitaxial growth; patterning the sacrificial layer and the III-V group compound on the support substrate to form the patterned first III-V group compound layer; and transferring the patterned first III-V group compound layer onto the first substrate.

In an embodiment, the forming of the patterned first III-V group compound layer may include etching the sacrificial layer and the III-V group compound on the support substrate by using an etching solution containing phosphoric acid ($H_3PO_4$).

In an embodiment, the transferring onto the first substrate may include: bonding the support substrate, the sacrificial layer on the support substrate and the patterned first III-V group compound layer to the first substrate so that the patterned first III-V group compound layer contacts the first substrate; and removing the sacrificial layer on the support substrate after the bonding to separate the support substrate from the first substrate.

In another aspect, there is provided a semiconductor device, which includes: a second III-V group compound layer grown from a patterned first III-V group compound layer by epitaxial growth; and a substrate having silicon and bonded to the second III-V group compound layer.

In an embodiment, the second III-V group compound layer may be directly bonded onto the second substrate. In another embodiment, semiconductor device may further include an adhesive layer disposed between the second III-V group compound layer and the second substrate. At this time, the adhesive layer may include metal or oxide.

In a method for manufacturing a semiconductor device according to an embodiment of the present disclosure, an epitaxial layer of an III-V group compound is patterned in advance to serve as a template for generating a semiconductor device. From the patterned III-V group compound layer of the template, a semiconductor device having another III-V group compound layer is manufactured by direct growth, and this it is possible to fundamentally prevent a defect caused by a lattice mismatch between the III-V group compound layer and another substrate, a difference in thermal expansion coefficient, a difference in polarity or the like. In addition, since a large-area template is produced by epitaxial lift-off, a large-area semiconductor device may be manufactured by direct growth. Further, since a substrate composed of an III-V group compound is not directly used, it is possible to reduce a limit in wafer size or an increase of cost.

DETAILED DESCRIPTION

Hereinafter, embodiments of the present disclosure will be described in detail with reference to the accompanying drawings.

FIGS. 1A to 1F are perspective views for illustrating each step of a method for manufacturing a template for direct growth of an III-V group compound layer at a semiconductor device according to an embodiment.

Figure 1A:
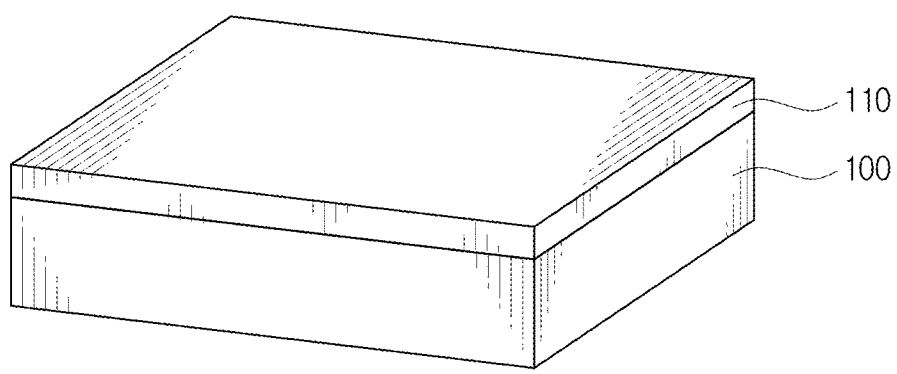
FIGS. 1A to 1F are perspective views for illustrating each step of a method for manufacturing a template for direct growth of an III-V group compound layer at a semiconductor device according to an embodiment.

Referring to FIG. 1A, first, a support substrate 100 made of an III-V group compound is prepared, and an etch stop layer 110 may be formed onto the support substrate 100. The support substrate 100 may be made of an III-V group compound such as gallium arsenide (GaAs), indium phosphide (InP), gallium nitride (GaN) or the like, without being limited thereto. In addition, the etch stop layer 110 may be made of material which is not dissolved during a process for etching the III-V group compound layer, described later. For example, if the support substrate 100 is made of GaAs, the etch stop layer 110 may be made of indium gallium phosphide (InGaP), indium phosphide (InP) or the like, and if the support substrate 100 is made of InP, the etch stop layer 110 may be made of indium gallium arsenide (InGaAs) or the like, without being limited thereto.

Figure 1B:
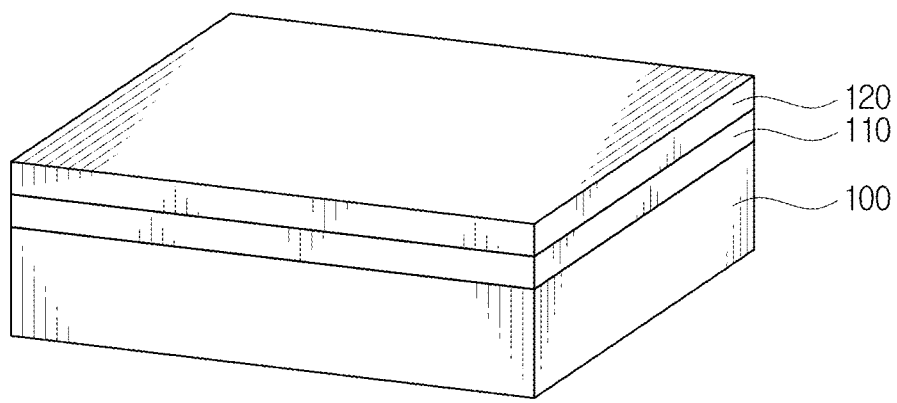
Figure 1C:
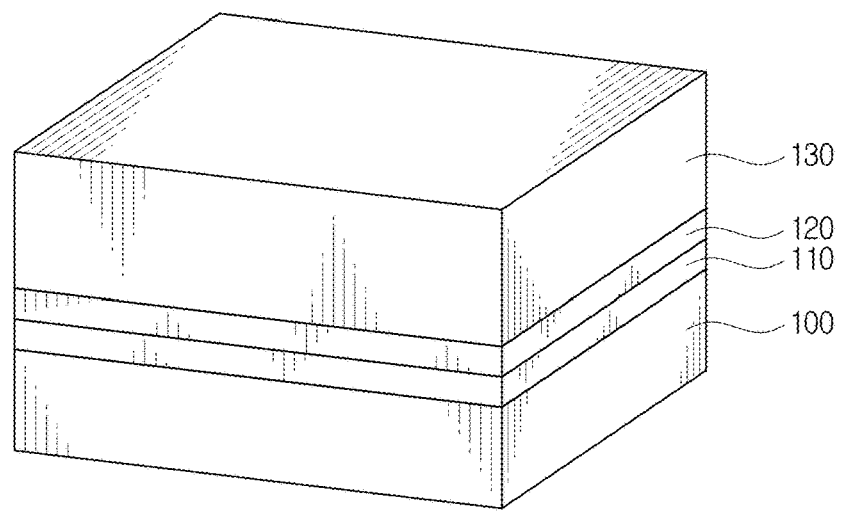

Referring to FIG. 1B, a sacrificial layer 120 may be formed on the etch stop layer 110. The sacrificial layer 120 is removed after an III-V group compound which is to form a template is bonded to a silicon (Si) substrate, so that the support substrate 100 and the etch stop layer 110 are separated from the silicon substrate. For example, the sacrificial layer 120 may be made of an III-V group compound containing high-concentration aluminum (Al) which is easily etched by a solution such as hydrogen fluoride (HF) or hydrogen chloride (HCl), without being limited thereto.

Referring to FIG. 1O, an III-V group compound layer 130 made of a semiconductor material required for forming a desired semiconductor device may be formed on the sacrificial layer 120. The III-V group compound layer 130 may be formed from the sacrificial layer 120 by epitaxial growth. In other words, by using III-V group atoms included in the sacrificial layer 120 as seeds, an III-V group compound may grow from the seed to form the III-V group compound layer 130. The material of the III-V group compound layer 130 may be diverse depending on the kind of a semiconductor device to be manufactured, and for example, may include gallium arsenide (GaAs), indium phosphide (InP), gallium nitride (GaN) or the like, without being limited thereto. In addition, the III-V group compound layer 130 may be at least partially n-doped or p-doped.

Figure 1D:
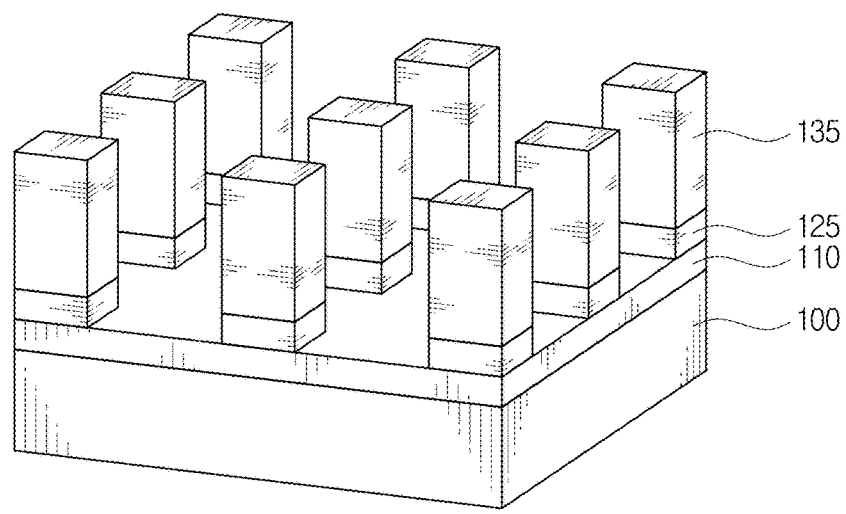

Referring to FIG. 1D, the sacrificial layer and III-V group compound layer may be patterned to form a patterned sacrificial layer 125 and a patterned III-V group compound layer 135. The patterning process may be performed by locating a photoresist (not shown) on the III-V group compound layer 130 of FIG. 1O, partially exposing and removing the photoresist by using a mask, and then exposing the resultant product to an etching solution so that the sacrificial layer and III-V group compound layer is etched in a region from which the photoresist is removed. The etching process may be performed as wet etching by using an etching solution based on phosphoric acid ($H_3PO_4$), without being limited thereto. After the etching process, the photoresist is removed.

Figure 1E:
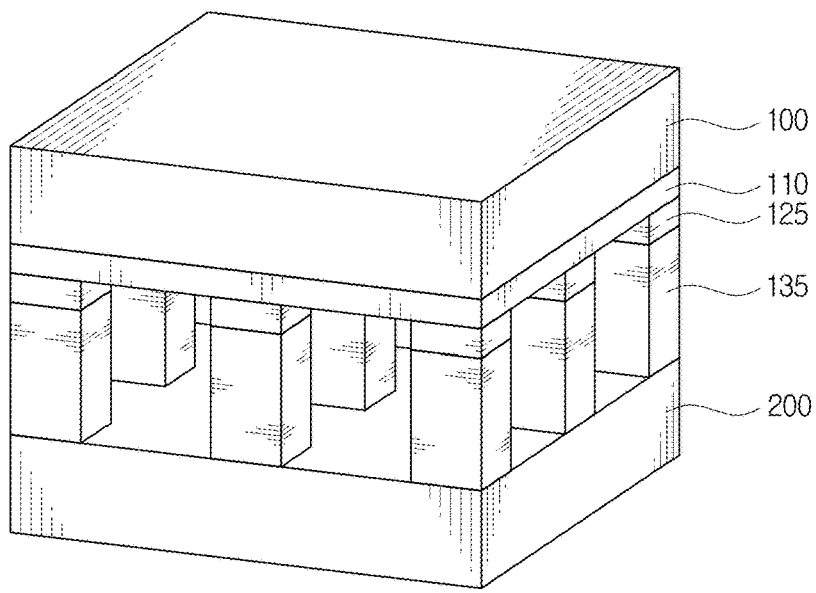

Referring to FIG. 1E, a structure composed of the support substrate 100, the etch stop layer 110, the patterned sacrificial layer 125 and the patterned III-V group compound layer 135 may be bonded to a substrate 200 made of silicon (Si). The bonding process is performed so that the patterned III-V group compound layer 135 contacts the substrate 200. In an embodiment, before the bonding process, a process of removing a natural oxide film formed on the surfaces of the III-V group compound layer 135 and/or the substrate 200 may be further performed. In addition, in an embodiment, before the bonding process, the surface of the III-V group compound layer 135 and/or the substrate 200 may be activated by plasma treatment.

In an embodiment, the III-V group compound layer 135 may be bonded to the substrate 200 by direct wafer bonding. In other words, the III-V group compound may be directly bonded to silicon of the substrate 200. The plasma treatment for bonding may be performed with a pressure of several ten mTorr and a power of several ten mW in a state where argon (Ar) gas flows by 30 sccm. In another embodiment, the III-V group compound layer 135 may be bonded to the substrate 200 by using an additional adhesive layer (not shown). The adhesive layer may include a single layer or multiple layers made of metal (for example, Pt, Au, Ni, Ag or the like) or oxide (for example, $SiO_2$, $Al_2O_3$, $Y_2O_3$, $ZrO_2$ or the like).

Figure 1F:
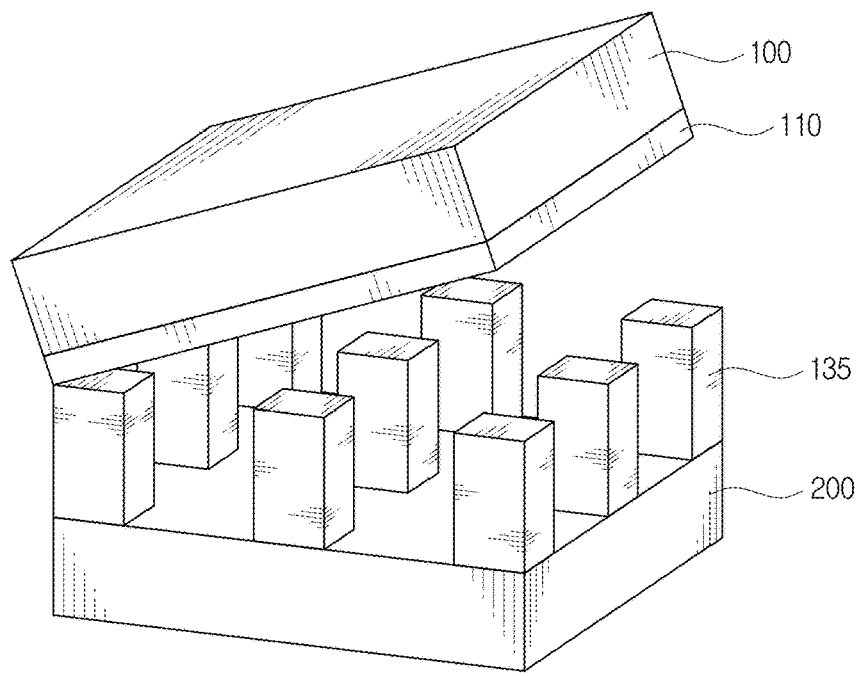

Referring to FIG. 1F, finally, the support substrate 100 and the etch stop layer 110 are removed by epitaxial lift-off (ELO). The ELO process is performed by removing the sacrificial layer 125 (FIG. 1E) by using an etching solution. At this time, the etching solution may be a hydrophilic solution containing hydrogen fluoride (HF). For example, the etching solution may be a solution in which hydrogen fluoride (HF) and deionized water (DIW) are mixed at predetermined ratios. In addition, in an embodiment, the etching solution may further include a hydrophilic solution such as isopropyl alcohol (IPA) and/or acetone. By adding these materials, gas bubbling created during the sacrificial layer removing process is restrained by the hydrophilic solution, which allows the etching solution to flow easier.

The structure including the substrate 200 and the patterned III-V group compound layer 135, obtained through the above procedure, may serve as a semiconductor device in itself and may also serve as a template for manufacturing another semiconductor device based on an III-V group compound. This will be described later in detail with reference to FIGS. 2A to 2C.

Meanwhile, in the template forming process described above, the sacrificial layer and the III-V group compound layer are patterned in advance and transferred onto the silicon substrate, which may maximize an exposed area of the sacrificial layer and reduce a time consumed by the ELO by etching the exposed sacrificial layer. In addition, since the III-V group compound is patterned in advance, voids or gas bubbles are not easily created while bonding the III-V group compound and the silicon substrate to each other, thereby restraining separation or breakage of the bonded structure and improving quality of the device. Further, a device isolation process may be omitted.

Figure 2A:
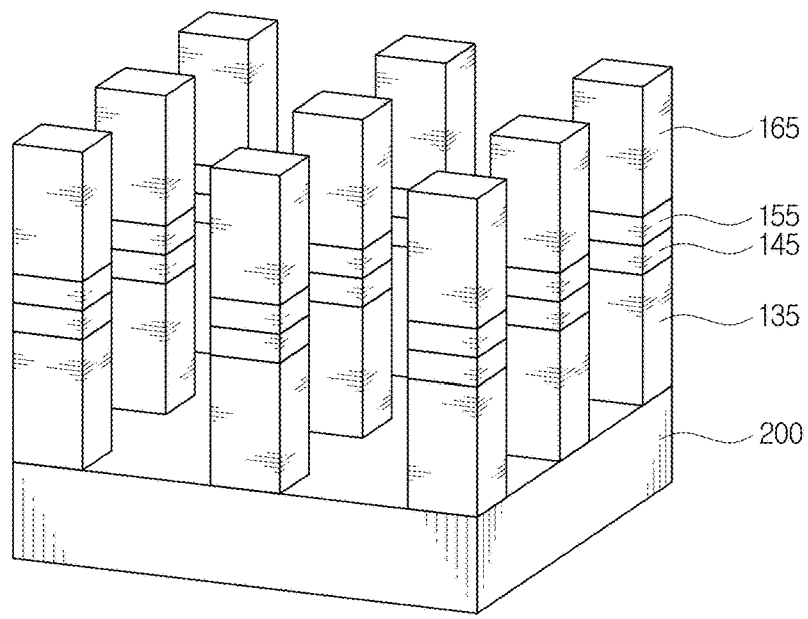
FIGS. 2A to 2C are perspective views for illustrating each step of a method for manufacturing a semiconductor device by using the template according to an embodiment.
Figure 2B:
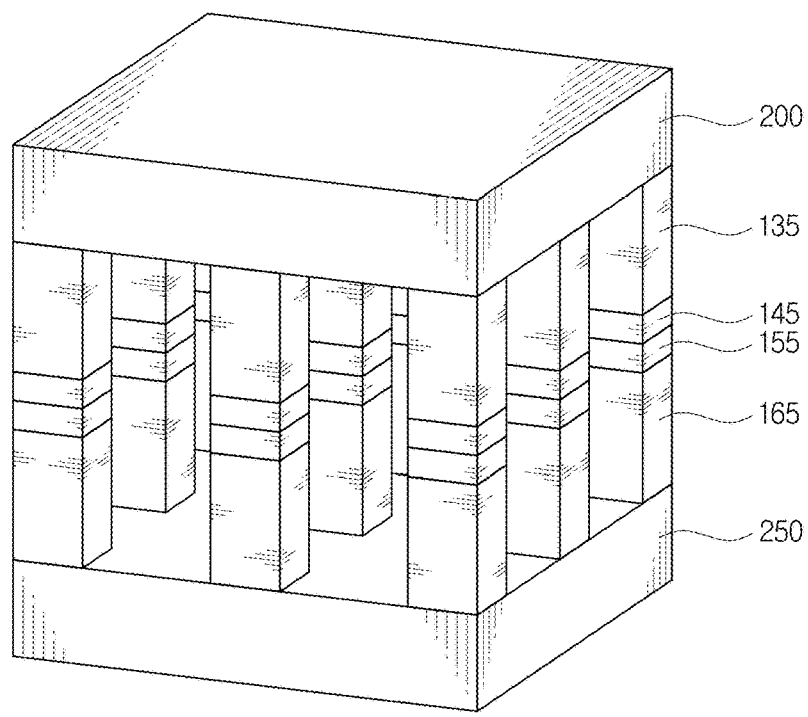
Figure 2C:
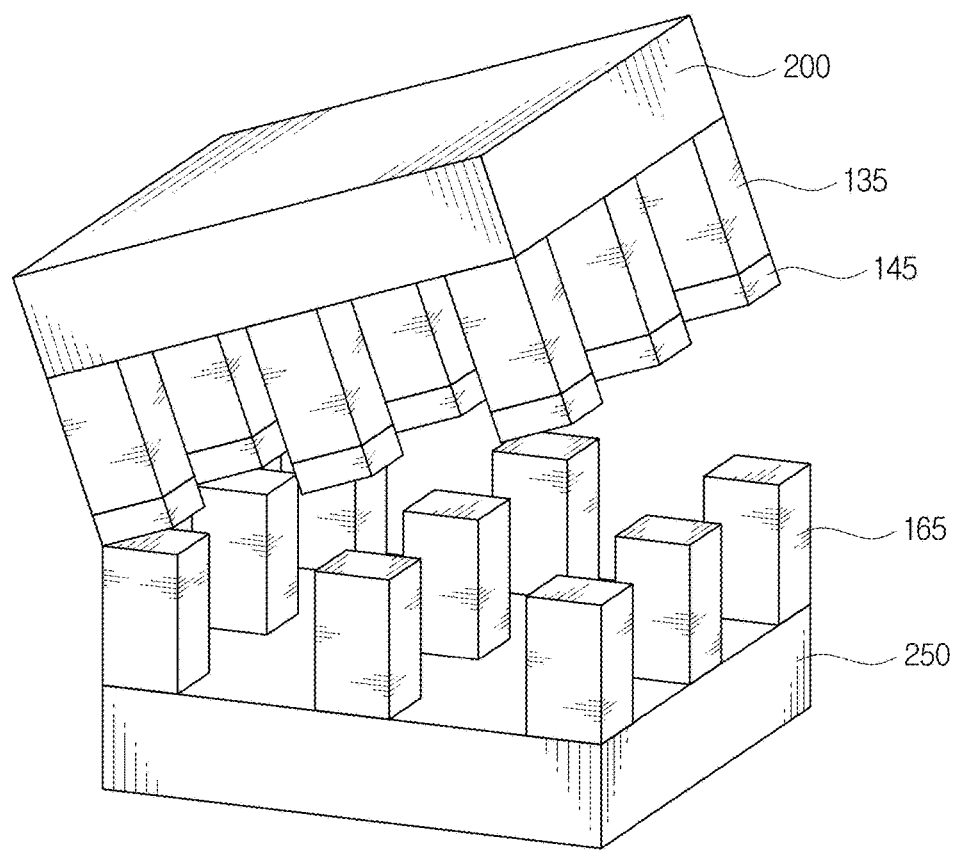

FIGS. 2A to 2C is a perspective view for illustrating each step of a method for manufacturing a semiconductor device by using the template according to an embodiment.

The semiconductor device manufacturing method of this embodiment may be performed by using a substrate 200 and a patterned III-V group compound layer 135 formed thereon, obtained through the procedure of FIG. 1F. In order to distinguish them from corresponding layers of a semiconductor device which is to be manufactured by using them, hereinafter, the substrate 200 of the template will be called a first substrate, and the patterned III-V group compound layer 135 of the template will be called a first III-V group compound layer.

Referring to FIG. 2A, an etch stop layer 145, a sacrificial layer 155 and a second III-V group compound layer 165 may be formed on the first III-V group compound layer 135. The etch stop layer 145, the sacrificial layer 155 and the second III-V group compound layer 165 may be directly grown on the first III-V group compound layer 135 by epitaxial growth in which the first III-V group compound layer 135 is used as a seed. Since the first III-V group compound layer 135 is patterned in advance by the procedure illustrated in FIGS. 1A to 1F, the etch stop layer 145, the sacrificial layer 155 and the second III-V group compound layer 165 are formed according to the shape of the patterned first III-V group compound layer 135 from the beginning, and an additional patterning process is not demanded.

The configurations of the etch stop layer 145 and the sacrificial layer 155 may be respectively identical to those of the etch stop layer 110 and the sacrificial layer 120 illustrated in FIGS. 1A to 1F, and the configuration of the second III-V group compound layer 165 may be identical to that of the first III-V group compound layer 135. For this reason, they are not described in detail here.

Referring to FIG. 2B, in sequence, a second III-V group compound layer 165 may be bonded to a second substrate 250 made of silicon (Si). The bonding process of the second III-V group compound layer 165 and the second substrate 250 may be identical to the bonding process of the first III-V group compound layer 135 and the first substrate 200 described above with reference to FIG. 1E. In other words, the second III-V group compound layer 165 and the second substrate 250 may be bonded by direct wafer bonding or by using an adhesive layer containing metal or oxide.

Referring to FIG. 2C, in sequence, the sacrificial layer 155 is removed by an ELO process to separate the second substrate 250 and the second III-V group compound layer 165 from the template. At this time, the etch stop layer 145 may also be additionally removed. The ELO process for removing the sacrificial layer 155 is identical to the process of removing the sacrificial layer 125 described above with reference to FIGS. 1E and 1F, and thus this is not described in detail here. After a semiconductor device composed of the second substrate 250 and the second III-V group compound layer 165 is manufactured through the above procedure, the first substrate 200 and the first III-V group compound layer 135, which correspond to the template, may be reused for manufacturing another semiconductor device.

Hereinafter, experimental results of semiconductor devices prepared by inventors will be described to show characteristics of the semiconductor devices according to a bonding type of the III-V group compound and the substrate, and a post-processing.

Figure 3A:
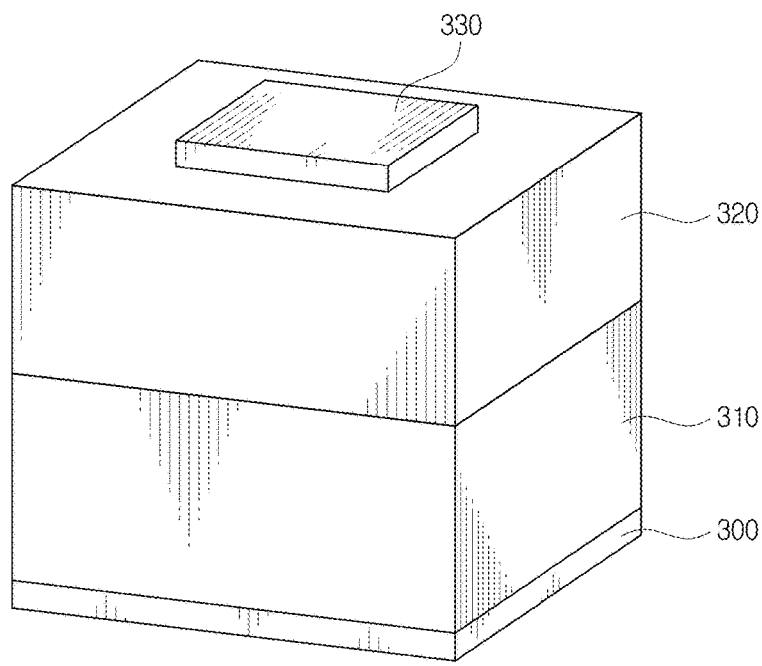
FIG. 3A is a schematic view showing a diode in which an III-V group compound is directly bonded to a silicon (Si) substrate according to an embodiment.
Figure 3B:
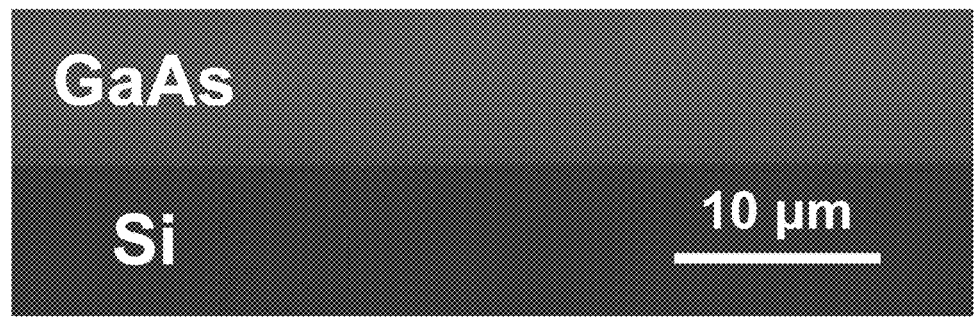
FIG. 3B is a scanning electron microscope (SEM) photograph showing a bonded surface of the III-V group compound and the silicon substrate in the diode depicted in FIG. 3A.

FIG. 3A is a schematic view showing a diode in which an III-V group compound is directly bonded to a silicon (Si) substrate according to an embodiment, and FIG. 3B is a scanning electron microscope (SEM) photograph showing a bonded surface of the III-V group compound and the silicon substrate in the diode depicted in FIG. 3A.

As shown in FIG. 3A, electrodes 300, 330 may be located respectively at upper and lower portions of a second substrate 310 and an III-V group compound layer 320, which are bonded by direct wafer bonding, to implement a diode as a semiconductor device. The depicted shape of each layer is just an example and is not intended to limit an actual shape or size of each layer. In addition, the semiconductor device manufactured according to embodiments is not limited to a diode, but various devices such as a solar cell, a transistor or the like may be manufactured according to the manufacturing method of the embodiments. Inventors performed a bonding process by using an III-V group compound layer 320 having a doping concentration of n-GaAs (1E18) or p-GaAs (1E19) and a second substrate 310 having a doping concentration of n-Si (1E19) or p-Si (1E19). As a result, it can be found that a bonded surface of GaAs and Si is clean as shown in the SEM photograph of FIG. 3B.

Figure 3C:
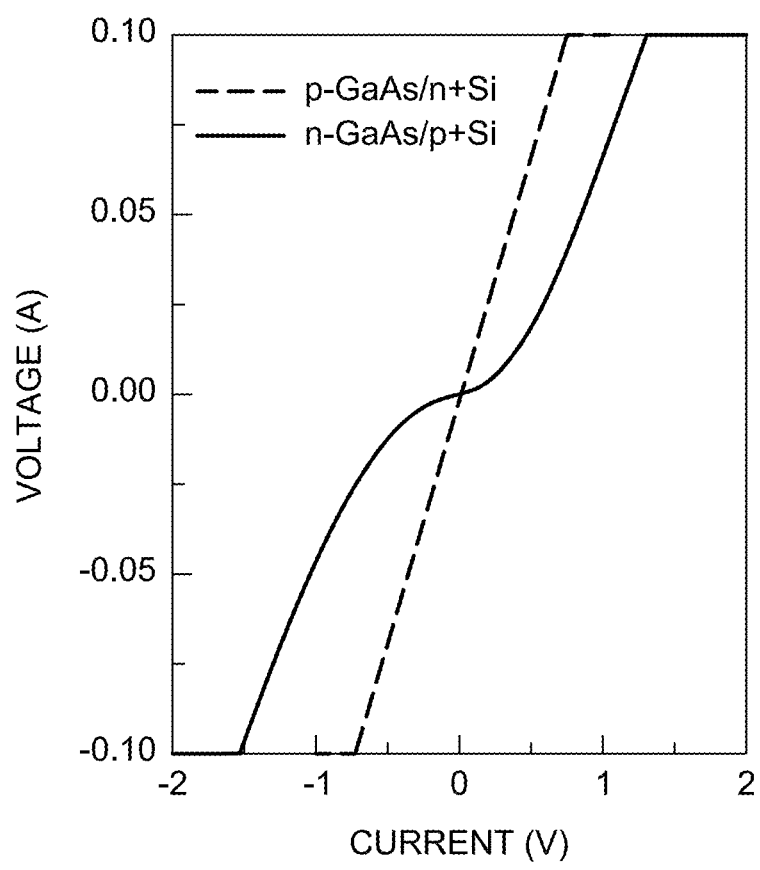
FIGS. 3C and 3D are graphs showing electric characteristics of the diode depicted in FIG. 3A.
Figure 3D:
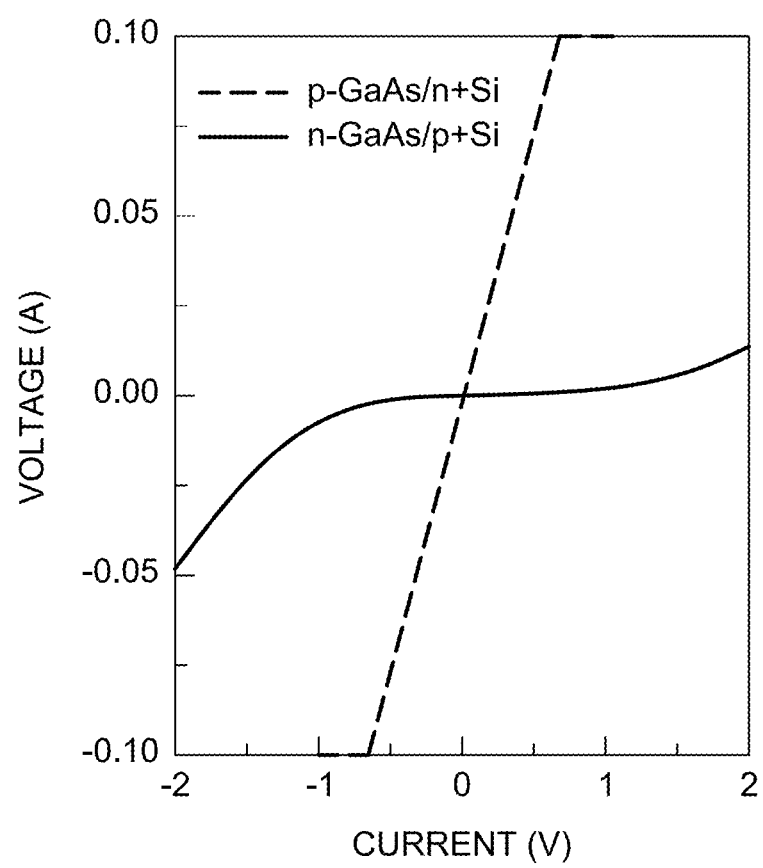

FIGS. 3C and 3D are graphs showing electric characteristics of the diode depicted in FIG. 3A. FIG. 3C shows electric characteristics of a diode having a structure of p-GaAs/n+Si and a diode having a structure of n-GaAs/p+Si. In addition, FIG. 3D shows electric characteristics of a diode having a structure of p-GaAs/p+Si and a diode having a structure of n-GaAs/n+Si. As shown in FIGS. 3C and 3D, it can be found that at bonded surfaces having various characteristics, the diode exhibits a rectifying characteristic and an ohmic characteristic due to discontinuity of a band and a doping concentration.

Figure 4A:
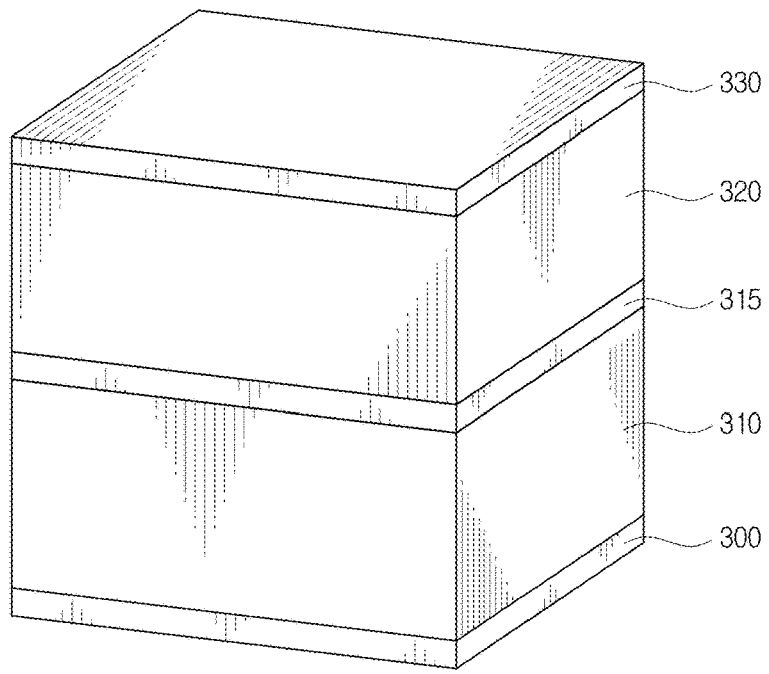
FIG. 4A is a schematic view showing a diode in which an III-V group compound and a silicon substrate are bonded by using a metal adhesive layer according to an embodiment.
Figure 4B:
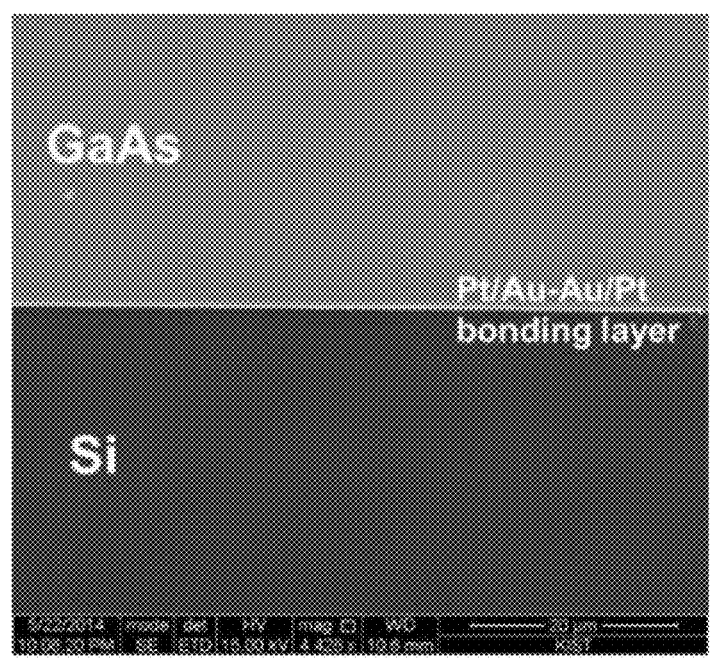
FIG. 4B is a SEM photograph showing a bonded surface of the III-V group compound and the silicon substrate in the diode depicted in FIG. 4A.

FIG. 4A is a schematic view showing a diode in which an III-V group compound and a silicon substrate are bonded by using a metal adhesive layer according to an embodiment, and FIG. 4B is a SEM photograph showing a bonded surface of the III-V group compound and the silicon substrate in the diode depicted in FIG. 4A.

As shown in FIG. 4A, a diode serving as a semiconductor device may be implemented by bonding a second substrate 310 and an III-V group compound layer 320 to each other by a metal adhesive layer 315 and locating electrodes 300, 330 respectively at upper and lower portions of the second substrate 310 and the III-V group compound layer 320. Inventors of the present disclosure have used GaAs as the III-V group compound layer 320 and deposited a multilayer of platinum (Pt) and gold (Au) on a surface of the GaAs by the metal adhesive layer 315 for adhesion. In this case, it can also be found that a bonded surface of GaAs and Si is clean as shown in the SEM photograph of FIG. 4B, and it is also found that debonding does not occur by hydrogen fluoride (HF).

Figure 4C:
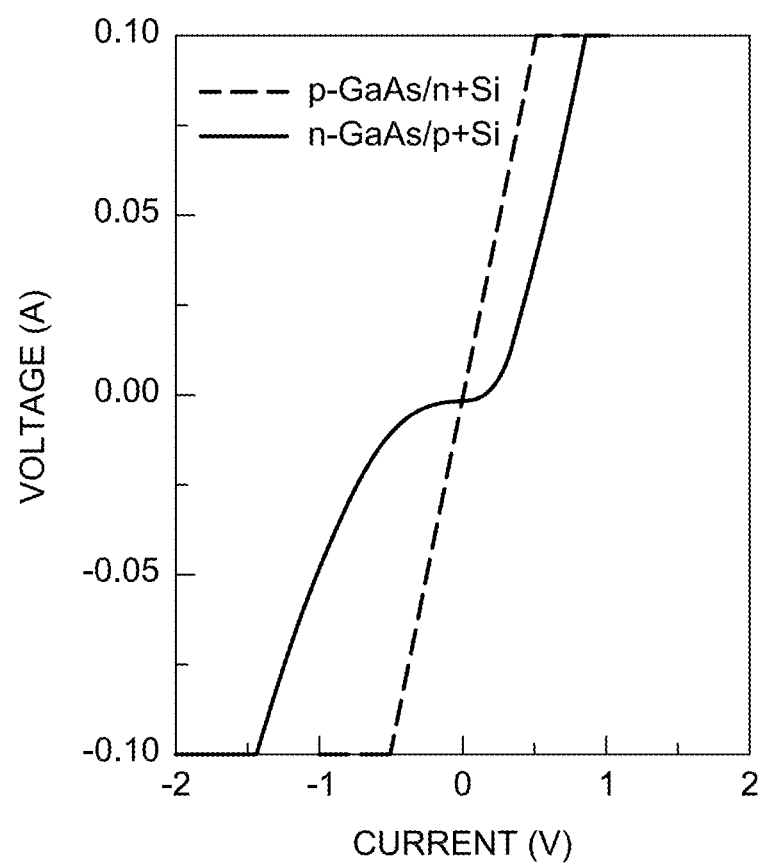
FIGS. 4C and 4D are graphs showing electric characteristics of the diode depicted in FIG. 4A.
Figure 4D:
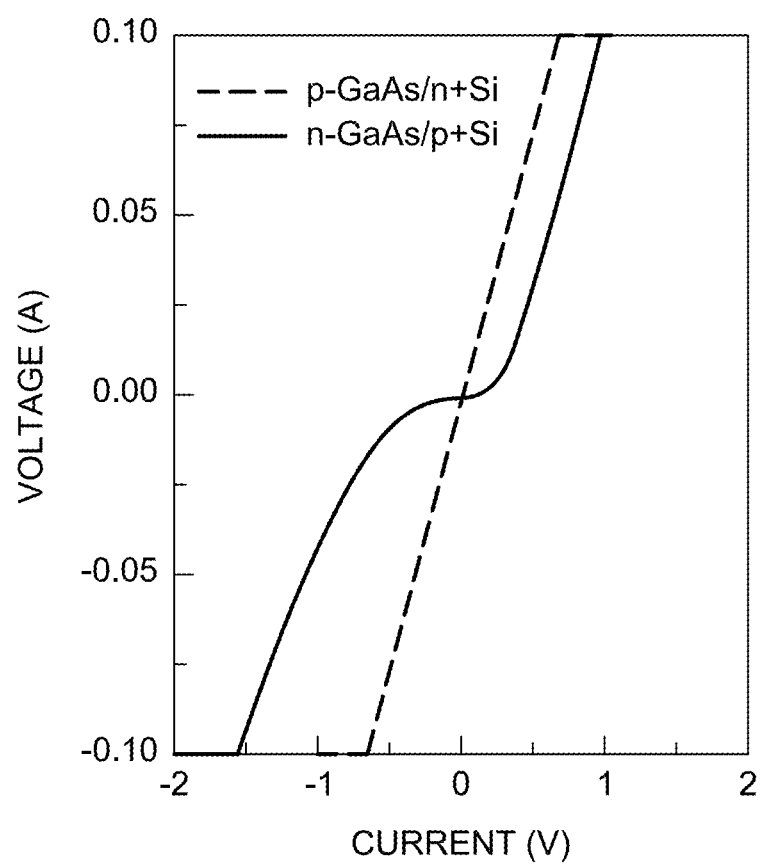

FIGS. 4C and 4D are graphs showing electric characteristics of the diode depicted in FIG. 4A. FIG. 4C shows electric characteristics of a diode having a structure of p-GaAs/metal/n+Si and a diode having a structure of n-GaAs/metal/p+Si. Also, FIG. 4D shows electric characteristics of a diode having a structure of p-GaAs/metal/p+Si and a diode having a structure of n-GaAs/metal/n+Si. If the results depicted in FIGS. 3C and 3D are compared, it can be found that an ohmic characteristic is improved not only in an existing structure having a rectifying characteristic but also in a diode of n-GaAs/metal layer/n+Si which has not exhibited a remarkable rectifying characteristic.

Figure 5A:
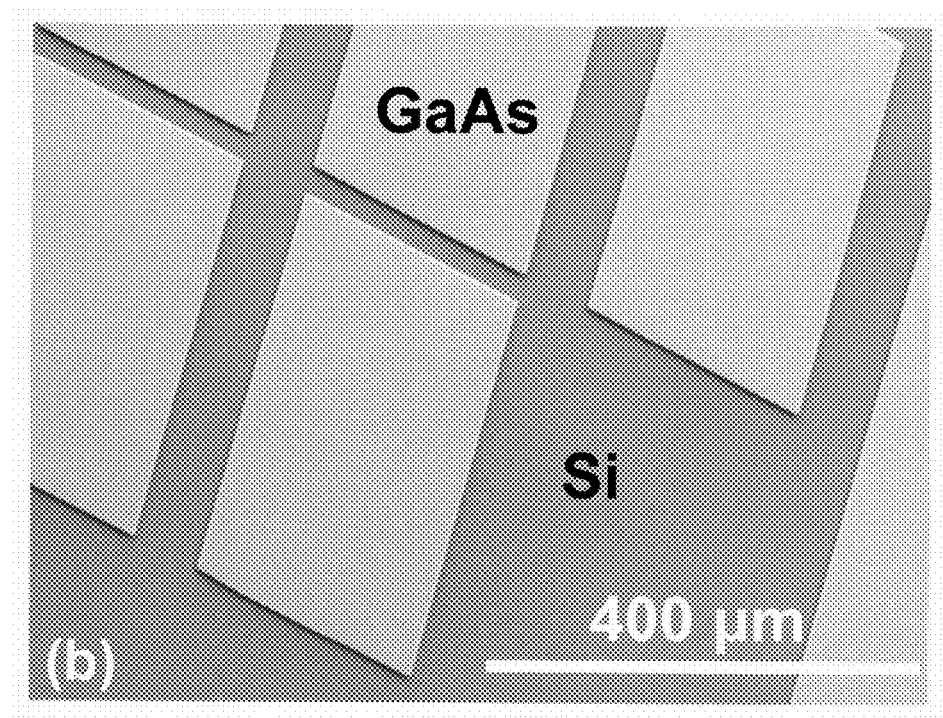
FIG. 5A is a SEM photograph showing a bonded surface at which an III-V group compound and a silicon substrate are directly bonded according to an embodiment.

FIG. 5A is a SEM photograph showing a bonded surface at which an III-V group compound and a silicon substrate are directly bonded according to an embodiment. Inventors of the present disclosure have obtained a bonded structure in which a patterned structure has clean edges and surfaces by direct wafer bonding as shown in FIG. 5A. After that, the inventors of the present disclosure have obtained a semiconductor device disposed on a Si substrate and composed of a patterned GaAs layer by performing ELO with a solution where hydrogen fluoride (HF) and deionized water (DIW) are mixed at a ratio of about 1:5.

Figure 5B:
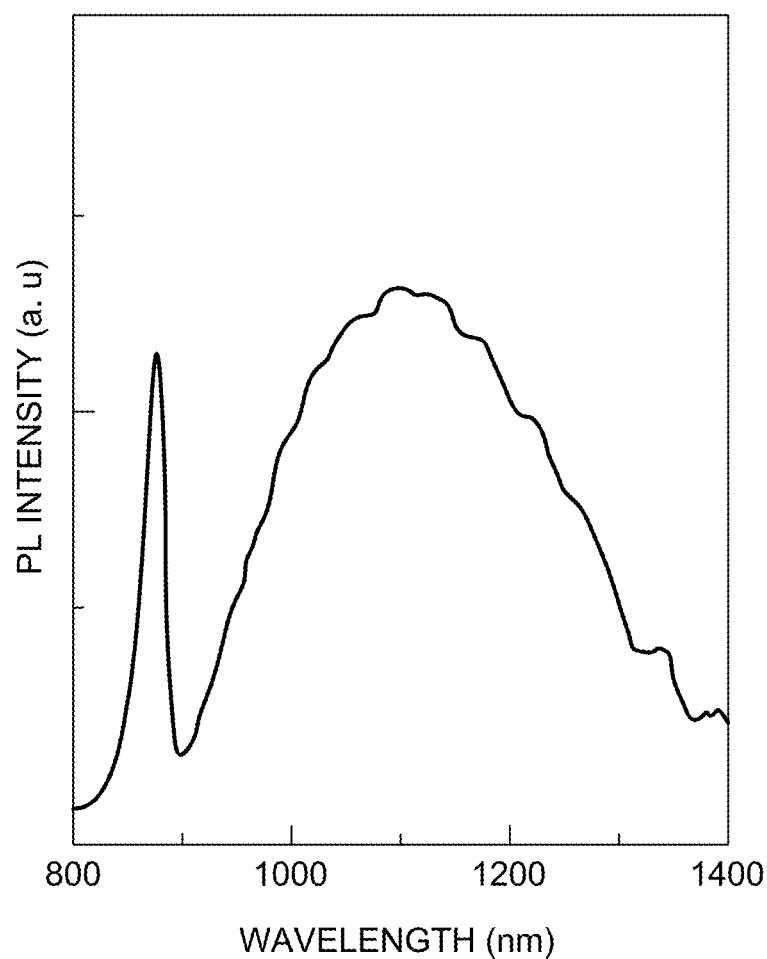
FIG. 5B shows a spectrum representing photoluminescence (PL) intensity (arbitrary unit) obtained by using the bonded structure depicted in FIG. 5A.

FIG. 5B shows a spectrum representing photoluminescence (PL) intensity (arbitrary unit) obtained by using the bonded structure depicted in FIG. 5A. As shown in FIG. 5B, it can be found that a sharp peak is exhibited near a wavelength of about 880 nm and a wide peak is exhibited at a wavelength of about 1000 nm or above, which respectively correspond to PL characteristics of GaAs and Si. From this, it can be understood that GaAs is normally transferred to Si in this embodiment.

Figure 6:
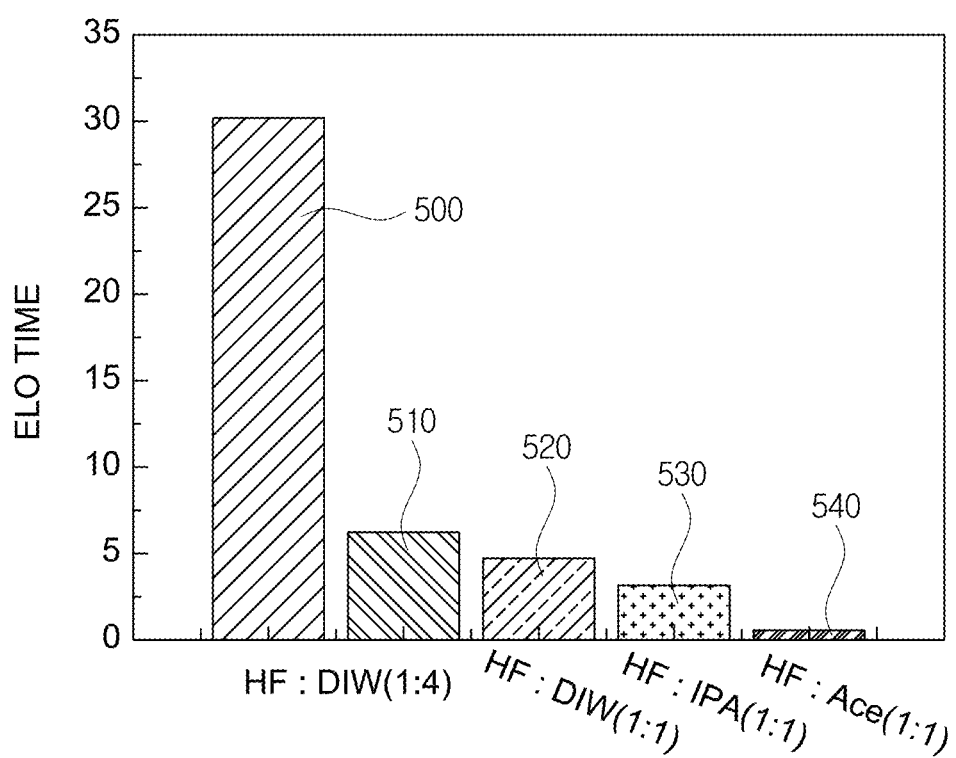
FIG. 6 is a graph showing a time consumed for epitaxial lift-off when an III-V group compound layer is patterned using various etching solutions according to examples of the present disclosure and comparative examples.

FIG. 6 is a graph showing a time consumed for epitaxial lift-off (ELO) when an III-V group compound layer is patterned using various etching solutions according to examples of the present disclosure and comparative examples.

In FIG. 6, a graph 500 shows a result when ELO is performed after transferring an III-V group compound to a Si substrate without patterning according to an existing technique, and graphs 510, 520, 530, 540 show results when ELO is performed by patterning an III-V group compound layer in advance according to the embodiments and then transferring the III-V group compound layer onto a Si substrate. As shown in FIG. 6, it can be understood that the time required for ELO in the embodiments is greatly reduced to about ⅕ in comparison to an existing technique where about 30 hours are consumed for ELO.

In addition, at lower ends of the graphs 510, 520, 530, 540 of FIG. 6 according to the embodiments, a composition of an etching solution used in the ELO process is depicted. If the graph 510 and the graph 520 are compared, it can be understood that the time required for ELO is reduced by increasing a ratio of hydrogen fluoride (HF) to deionized water (DIW) in the etching solution used in ELO. Further, if the graph 530 and the graph 540 are referred to, it can be found that the time required for ELO is further reduced when isopropyl alcohol (IPA) or acetone (Ace) is added to the etching solution, and particularly, it can be found that the ELO process is completed just with about 20 minutes, in the graph 540 using an etching solution where a ratio of hydrogen fluoride (HF) and acetone is 1:1. In this regard, it may be guessed that the etching solution flows easier by restraining gas bubbling generated while removing the sacrificial layer since the hydrophilic property of the etching solution is improved due to isopropyl alcohol (IPA) or acetone (Ace).

FIGS. 7A to 7D are photographs showing a result of rapid thermal annealing (RTA) of semiconductor devices manufactured according to examples of the present disclosure and comparative examples. The RTA was performed for about 40 seconds under the nitrogen ($N_2$) atmosphere.

Figure 7A:
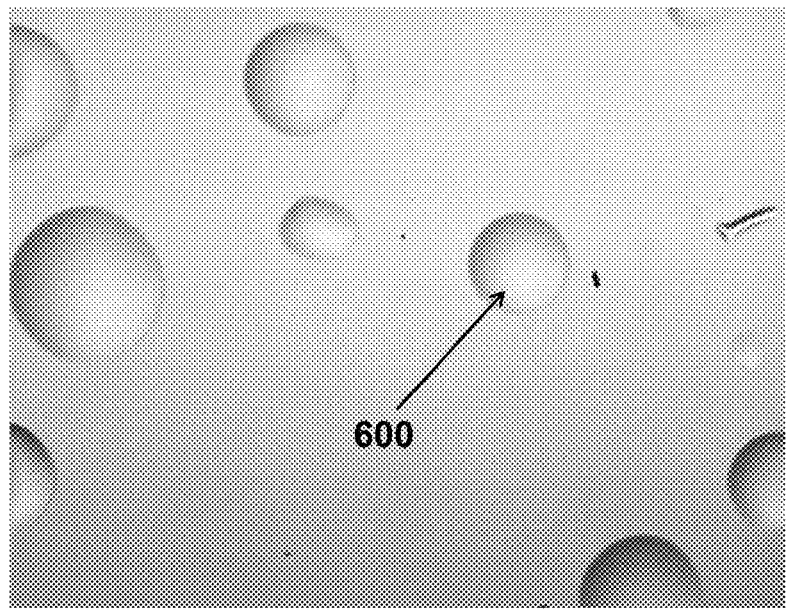
FIGS. 7A to 7D are photographs showing a result of rapid thermal annealing (RTA) of semiconductor devices manufactured according to examples of the present disclosure and comparative examples.
Figure 7B:
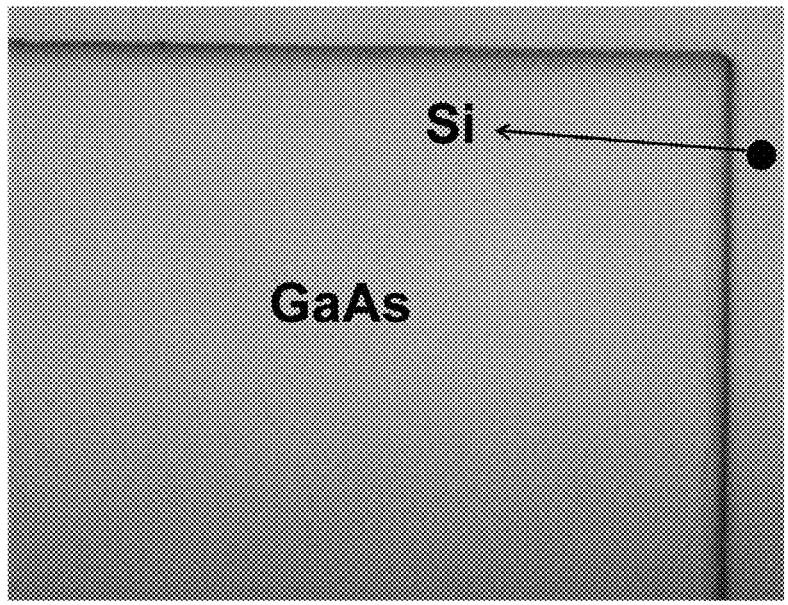
Figure 7C:
Figure 7D:
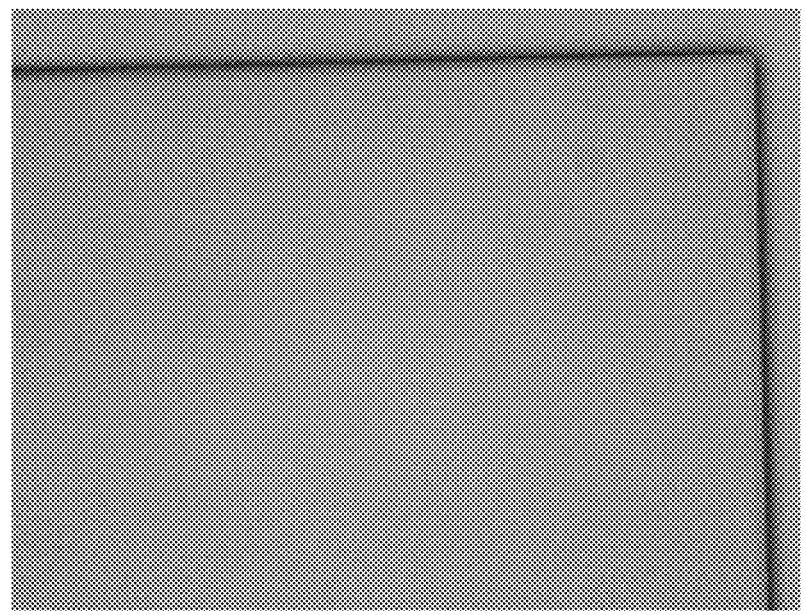

The RTA results of FIGS. 7A to 7D are obtained using a structure where GaAs is bonded on a Si substrate. Here, FIG. 7A shows a state after the RTA is performed at about 400° C. without patterning GaAs as in an existing technique, FIG. 7B shows a state when RTA is not performed but GaAs is patterned according to an embodiment, and FIGS. 7C and 7D show a state after RTA is performed respectively at about 400° C. and about 700° C. to a patterned GaAs according to embodiments. In an existing technique, air bubbles 600 are generated due to outgassing during an annealing process as shown in FIG. 7A. Meanwhile, if GaAs are patterned in advance as in the embodiments, it can be found that no air bubble is generated. This is because a retreat route of air molecules coming out from a solid during thermal treatment is ensured by transferring the patterned GaAs to the Si substrate.

Figure 8:
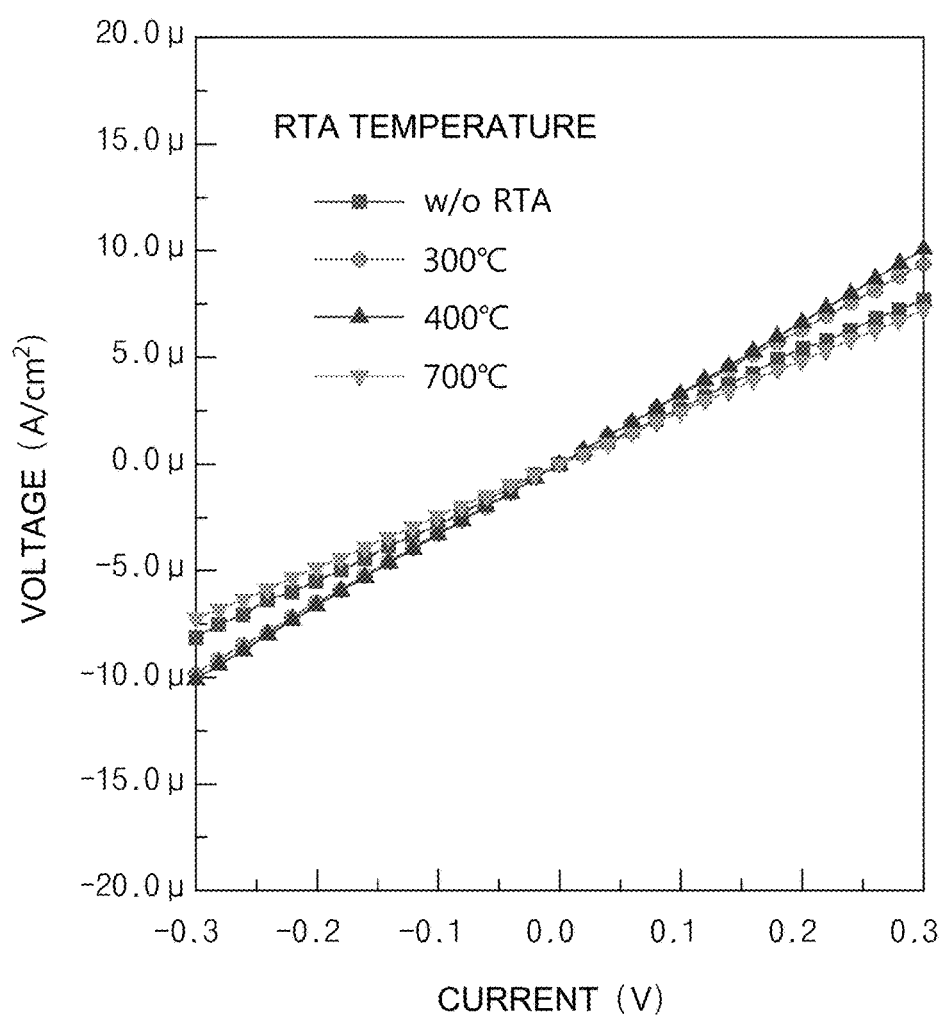
FIG. 8 is a graph showing electric characteristics of diodes prepared according to examples of the present disclosure before and after RTA.

FIG. 8 is a graph showing electric characteristics of diodes prepared according to examples of the present disclosure before and after RTA.

FIG. 8 shows electric characteristics of diodes prepared according to the embodiments, when RTA is not performed and when RTA is performed at about 300° C., about 400° C. and about 700° C., respectively. As shown in FIG. 8, it can be found that after RTA is performed, the diode exhibits similar characteristics without degradation caused by thermal treatment in comparison to the case before RTA is performed.

While the exemplary embodiments have been shown and described, it will be understood by those skilled in the art that various changes in form and details may be made thereto without departing from the spirit and scope of the present disclosure as defined by the appended claims. In addition, many modifications can be made to adapt a particular situation or material to the teachings of the present disclosure without departing from the essential scope thereof. Therefore, it is intended that the present disclosure not be limited to the particular exemplary embodiments disclosed as the best mode contemplated for carrying out the present disclosure, but that the present disclosure will include all embodiments falling within the scope of the appended claims.

What is claimed is:

1. A method for manufacturing a semiconductor device, comprising:
    providing a template having a first substrate and a patterned first III-V group compound layer disposed on the first substrate, wherein the providing of the template includes forming the patterned first III-V group compound layer by patterning the first III-V group compound layer on a first sacrificial layer;
    forming an etch stop layer, apportioned according to a shape of the patterned first III-V group compound layer without additional patterning process, on the patterned first III-V group compound layer by epitaxial growth;
    forming a second sacrificial layer on the etch stop layer by the epitaxial growth;
    forming a second III-V group compound layer on the second sacrificial layer by the epitaxial growth;
    bonding a second substrate made of silicon onto the second III-V group compound layer; and
    separating the second III-V group compound layer and the second substrate from the template by removing the second sacrificial layer.

2. The method for manufacturing a semiconductor device according to claim 1, wherein the bonding of a second substrate includes directly bonding the second III-V group compound layer and the second substrate to each other.

3. The method for manufacturing a semiconductor device according to claim 1, wherein the bonding of the second substrate includes:
    forming an adhesive layer on at least one of the second III-V group compound layer and the second substrate; and
    bonding the second III-V group compound layer and the second substrate to each other by using the adhesive layer.

4. The method for manufacturing a semiconductor device according to claim 3, wherein the adhesive layer includes metal or oxide.

5. The method for manufacturing a semiconductor device according to claim 1, wherein the separating of the second III-V group compound layer and the second substrate from the template includes removing the second sacrificial layer by using a hydrophilic etching solution containing hydrogen fluoride (HF).

6. The method for manufacturing a semiconductor device according to claim 5, wherein the etching solution further contains at least one of isopropyl alcohol and acetone.

7. The method for manufacturing a semiconductor device according to claim 1, wherein the providing of the template further includes:
    forming an first etch stop layer on a support substrate having an III-V group compound;
    forming the first sacrificial layer on the first etch stop layer;
    forming the III-V group compound on the first sacrificial layer on the support substrate by epitaxial growth;
    patterning the first sacrificial layer and the III-V group compound on the support substrate to form the patterned first III-V group compound layer; and
    transferring the patterned first III-V group compound layer onto the first substrate.

8. The method for manufacturing a semiconductor device according to claim 7, wherein the forming of the patterned first III-V group compound layer includes etching the first sacrificial layer and the III-V group compound on the support substrate by using an etching solution containing phosphoric acid ($H_3PO_4$).

9. The method for manufacturing a semiconductor device according to claim 7, wherein the transferring onto the first substrate includes:
    bonding the support substrate, the first sacrificial layer on the support substrate and the patterned first III-V group compound layer to the first substrate so that the patterned first III-V group compound layer contacts the first substrate; and
    removing the first sacrificial layer on the support substrate after the bonding to separate the support substrate from the first substrate.

10. The method for manufacturing a semiconductor device according to claim 1, wherein
    the first substrate is made of GaAs, and the etch stop layer is made of indium gallium phosphide (InGaP), or indium phosphide (InP), such that the etch stop layer is not dissolved during an etching process.

11. The method for manufacturing a semiconductor device according to claim 5, wherein the separating of the second III-V group compound layer and the second substrate from the template further includes removing the etch stop layer.

12. The method for manufacturing a semiconductor device according to claim 1, wherein the first substrate is made of indium phosphide (InP), and the etch stop layer is made of indium gallium arsenide (InGaAs), such that the etch stop layer is not dissolved during an etching process.

13. A method for manufacturing a semiconductor device, comprising:
    providing a template having a first substrate and a patterned first III-V group compound layer disposed on the first substrate;
    forming an etch stop layer, apportioned according to a shape of the patterned first III-V group compound layer without additional patterning process, on the patterned first III-V group compound layer by epitaxial growth;
    forming a sacrificial layer on the etch stop layer by the epitaxial growth;
    forming a second III-V group compound layer on the sacrificial layer by the epitaxial growth;
    bonding a second substrate made of silicon onto the second III-V group compound layer; and
    separating the second III-V group compound layer and the second substrate from the template by removing the sacrificial layer, wherein
    the etch stop layer is not dissolved during an etching process using an etching solution in the removing of the sacrificial layer.

* * * * *